United States Patent

Cushman et al.

[15] 3,641,563

[45] Feb. 8, 1972

[54] CORRECTION CIRCUIT FOR CONVERTERS

[72] Inventors: Glenn F. Cushman, Burlington; Brijeshwari Prasad, Methuen; Robert W. Wisleder, Wilmington, all of Mass.

[73] Assignee: Litton Systems, Inc., Burlington, Mass.

[22] Filed: Feb. 25, 1970

[21] Appl. No.: 14,025

[52] U.S. Cl. .................................340/347 AD, 340/347 CC
[51] Int. Cl. ........................................................H03k 13/02
[58] Field of Search ..........................................340/347 AD

[56] References Cited

UNITED STATES PATENTS

| | | | |
|---|---|---|---|
| 3,508,252 | 4/1970 | Van Blarcom | 340/347 |
| 3,430,225 | 2/1969 | Avignon | 340/347 |

*Primary Examiner*—Maynard R. Wilbur
*Assistant Examiner*—Jeremiah Glassman
*Attorney*—M. Michael Carpenter, Alan C. Rose and Alfred B. Levine

[57] ABSTRACT

An error correction circuit for an analog-to-digital converter is shown wherein and analog-to-digital converter includes a counter-and-storage circuit that stores an analog input signal in the form of a preliminary digital signal. An error sample-and-hold circuit receives an error signal, including switching and offset errors, generated by the analog-to-digital converter and stores that signal while the switching and offset errors are removed therefrom. The resulting signal is then applied to a second analog-to-digital converter where it is converted to a digital error signal which is applied to the counter circuit. The counter removes the digital error signal from the stored preliminary digital signal and stores the final corrected digital signal within the storage circuit. This error correction circuit does not cause an increased quantization error while removing the switching and offset errors from the input signal.

11 Claims, 5 Drawing Figures

INVENTORS
GLENN F. CUSHMAN
BRIJESHWARI PRASAD
ROBERT W. WISLEDER

BY M. Michael Carpenter
ATTORNEY

INVENTORS
GLENN F. CUSHMAN
BRIJESHWARI PRASAD
ROBERT W. WISLEDER

BY M. Michael Carpenter
ATTORNEY

INVENTORS
GLENN F. CUSHMAN
BRIJESHWARI PRASAD
ROBERT W. WISLEDER

BY M. Michael Carpenter
ATTORNEY

INVENTORS
GLENN F. CUSHMAN
BRIJESHWARI PRASAD
ROBERT W. WISLEDER

BY M. Michael Carpenter
ATTORNEY

INVENTORS
GLENN F. CUSHMAN
BRIJESHWARI PRASAD
ROBERT W. WISLEDER
BY M. Michael Carpenter
ATTORNEY

CORRECTION CIRCUIT FOR CONVERTERS

The present invention relates to a correction circuit for a converter; and, more particularly, to an error correction circuit for an analog-to-digital converter which removes switching and offset errors normally found therein.

The use of converter circuits to convert an analog signal to a digital signal is well known in the electronics and computer arts. These converters often include integrated circuits utilizing transistorized components including operational amplifiers. An operational amplifier is a high-impedance, direct current amplifier having it output connected through a feedback circuit to an input-summing junction connected to a first input terminal thereof. The operational amplifier retains the potential on the summing junction at a value equal to the value of a reference potential applied to the second input terminal thereof. In this type of device, the output signal varies depending on the ratio of the input and feedback impedances connected to the summing junction.

One prior art converter applies an analog input signal to the summing junction of an operation amplifier and digitally generates the analog feedback potential necessary to balance the summing junction. The circuitry that generates the feedback potential is also utilized to generate a digital output signal for digitally indicating the analog input signal. The feedback-generating circuitry of the prior art converter includes a series of switching circuits which switch associated resistances in or out for establishing the feedback potential. As they introduce associated resistances, the switching circuits also introduce a quantization error since each switch step cannot be made infinitely small. Another error introduced into the prior art converters is an offset error caused by the drift of the amplifiers used therein. Yet another error may be introduced by switching in multiplexing circuits on the input end of the converter.

The prior art analog-to-digital converters have introduced several error-reducing schemes to correct and improve the digital outputs thereof. One such scheme similar to that just discussed connects the input of the converter to ground and then converts the analog output of the operational amplifier therein to a digital value which is stored and reconverted to an analog feedback. One problem with this approach is that it introduces a quantization error each time a conversion is made. That is, the correction introduces two quantization errors while reducing the offset error.

A common form of analog-to-digital converter is the so-called resolver-to-digital converter wherein analog signals are generated from a radial rather than linear source, such as a shaft position. As this form of input signal is not based on a linear function, the arrangement of the operational amplifiers and feedback circuits necessary to digitally approximate the input shaft angle is considerably more complex. To create such an approximation, several operational amplifiers are selectively switched into and out of the circuit. If the prior art error reducing scheme of digitally generating an analog feedback potential to the input of an operational amplifier circuit were used, the analog feedback potential would have to be adjusted as each operational amplifier was switched into or out of the circuit. This would require several steps of adjustment and introduce time delays as well as large quantization errors. Also, an excessive amount of hardware would be required.

Accordingly, it is an object of the present invention to provide an analog-to-digial converter with an improved error correction circuit.

Another object of this invention provides a converter of analog-to-digital information with a correction system which removes switching and offset errors from the digital output of the analog input signal without augmenting the quantization error in the converter.

Still another object of the invention herein presented is to provide an analog-to-digital converter with a rapid error correction circuit capable of a high degree of accuracy.

A further object of this invention provides an analog-to-digital converter with an error correction circuit which removes the error in a minimum number of steps.

Still a further object of the invention is to provide an analog-to-digital converter which makes a preliminary conversion of analog-to-digital information, corrects that conversion once, and generates a final corrected digital output.

In accomplishing these and other objects of the present invention, there is provided an analog-to-digital converter having a counting-and-storage circuit in which a preliminary digital conversion of an analog input is made and from which an analog error signal is generated. An error circuit receives the analog error signal and removes offset and switching errors therefrom prior to applying the corrected signal thus established to an error analog-to-digital converter. The resulting digital signal is applied to the counting-and-storage circuit and removed from the preliminary digital signal stored therein for producing a corrected digital signal.

Other objects; and many of the attendant advantages of the present invention will become more apparent to those skilled in the art as a better understanding thereof is obtained by reference to the following specification when considered in connection with the accompanying drawings, wherein.

Figure 1:
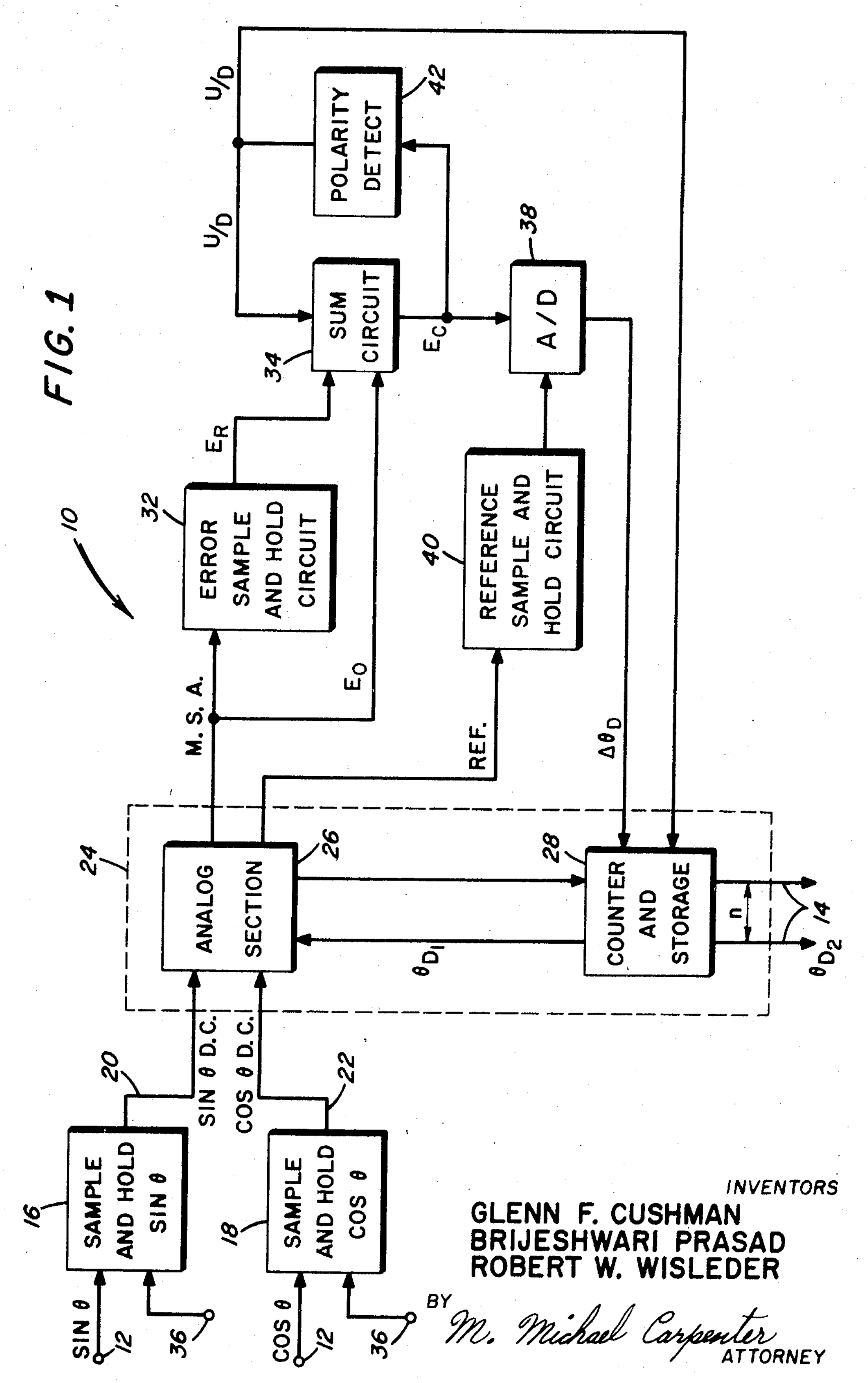
FIG. 1 is a block diagram, showing a converter and error correction circuit of the present invention.

Referring now to the drawings, a converter and a correction circuit embodied therein are shown generally at 10 in FIG. 1 having a pair of analog input terminals 12 and digital output terminals 14. The input terminals receive an analog signal from a suitable transducer source, such as a resolver which generates analog signals representing the sine and cosine of a shaft angle $\theta$. The transducers which generate the sin $\theta$ and cos $\theta$ signals are offset 90° within the resolver to provide a pair of analog signals aligned in time in a signal peak-to-peak relation for converter comparison. These peak-to-peak analog signals are applied through the input terminals 12 to a sine and cosine sample-and-hold circuit 16 and 18, respectively. As the sample-and-hold circuits are similar, only one is shown in detail in FIG. 3 and will be hereinafter described. The sample-and-hold circuits 16 and 18 are driven by a pulse generator, not shown, that is derived from the signal exciting the resolver. Thus, these circuits connect the peak of each sin $\theta$, cos $\theta$ signal to an operational amplifier which is provided with a capacitor feedback memory. The peak signals are stored as a DC potential within each capacitor and applied through output terminals 20 and 22 of the respective sin $\theta$, cos $\theta$ sample-and-hold circuits 16 and 18 to the input of a converter 24 having an analog section 26 and a digital counter-and-storage section 28. The converter 24 may be one of several types of analog-to-digital converters including a resolver-to-digital converter using the sequential conversion technique or a resolver-to-digital converter using the successive approximation technique. In the preferred embodiment described herein, an analog-to-digital converter of the resolver-to-digital type using successive approximation will be discussed.

The analog section 26 receives the stored DC sin $\theta$ and DC cos $\theta$ signal from the output terminals 20 and 22 through a quadrant select circuit, to be described hereinbelow. The output of the main summing amplifier MSA within the analog section 26 is established by the digital counter-and-storage section 28 as it counts through the successive steps and adjusts the circuits within the analog section 26 to approximate the analog input signal. The MSA signal is applied to an error sample-and-hold circuit 32 which includes an operational amplifier and capacitor memory circuit, similar to the sin $\theta$, cos $\theta$ sample-and-hold circuits 16 and 18. The error sample-and-hold circuit 32, to be described with reference to FIG. 4, stores a residual analog error signal $E_R$ for later application to a summing circuit 34. The MSA signal is also connected directly to the summing circuit 34 for applying an offset error signal $E_o$ thereto when the inputs of the sin $\theta$, cos $\theta$ sample-and-hold circuits 16 and 18 are connected to a source of reference potential 36, such as ground. The output of the summing circuit 34 connects to a simplified error analog-to-digital conversion circuit 38 and applies a corrected error signal $E_c$ thereto which is the result of the difference between the residual analog error signal $E_R$ and the offset error signal $E_o$.

The analog section 26 further generates a reference signal REF from a cosine generating circuit to be described hereinbelow. This reference signal REF is fed through a reference sample-and-hold circuit 40 which is substantially the same as the error sample-and-hold circuit 32 before being applied to the error analog-to-digital converter 38. The analog-to-digital converter 38 compares the reference signal REF against the corrected error signal $E_c$ and generates a digital error signal $\Delta\theta_D$ which represents the analog correction error signal $E_c$. The digital error signal $\Delta\theta_D$ is then supplied to the digital counter-and-storage section 28 of the analog-to-digital converter 24 for correcting a preliminary digital signal $\theta_{D1}$ stored therein. This preliminary digital signal was established by the digital counter-and-storage section 28 as the MSA signal applied to the error sample-and-hold circuit 32 was generated. The digital error signal $\Delta\theta_D$ from the error analog-to-digital converter 38 is subtracted from or added to the preliminary digital signal $\theta_{D1}$ stored within section 28 under the control of a polarity detect circuit 42 for producing a corrected digital output signal $\theta_{D2}$.

The polarity detect circuit 42 connects in a feedback arrangement around the summing circuit 34. This circuit 42 senses the polarity of the corrected error signal $E_c$ and switches the inputs to the summing circuit 42 to insure that the negative and positive signals are always applied to the correct terminals. This is done by generating an up/down signal U/D which is also supplied to the digital counter-and-storage section 28 for controlling the digital error signal $\Delta\theta_D$ and determine whether it will be subtracted from or added to the preliminary digital signal $\theta_{D1}$.

Figure 2:
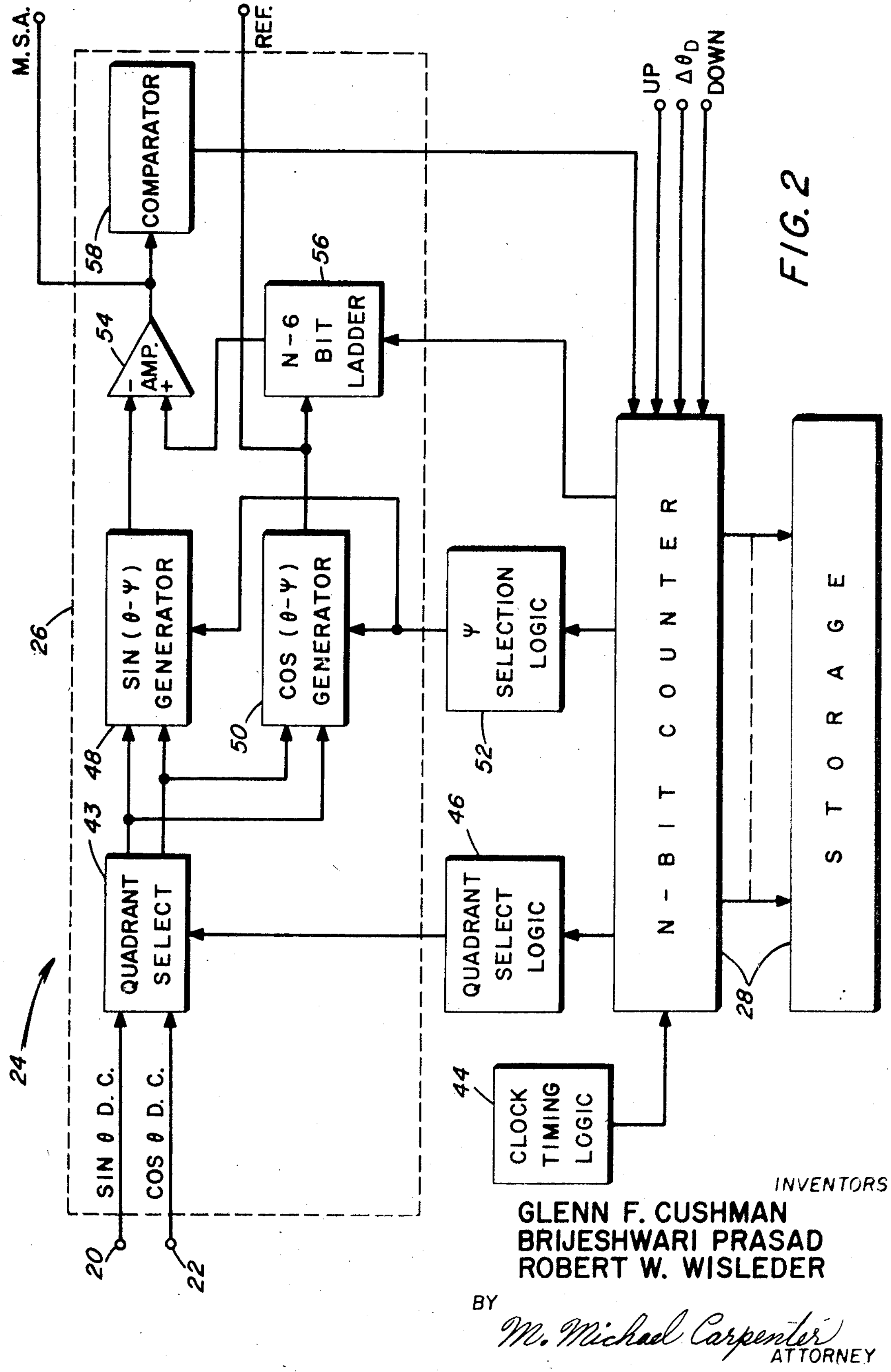
FIG. 2 is a block diagram of a converter in which the correction circuit of the present invention may be embodied.

The analog-to-digital converter 24 includes the analog section 26 and the digital section 28 which are interconnected to generate a digital output employing the successive approximation technique. As shown in FIG. 2, the sin $\theta$ and cos $\theta$ output terminals 20 and 22 are connected to a quadrant selection circuit 43. The quadrant selection circuit 43 functions to normalize the sine and cosine signals from the sin $\theta$ and cos $\theta$ sample-and-hold circuits 16 and 18 so that their polarities are always that of the normal quadrant. A quadrant selector logic circuit 46 is connected to receive a binary output from the digital counter-and-storage circuit 28 to determine the quadrant in which the sin $\theta$ and cos $\theta$ lie. The signal thus generated is applied to the quadrant select circuit 43 to either invert or not invert the sine and cosine signals for normalizing the polarities of the outputs therefrom.

The quadrant select circuit 43 supplies DC levels representing the sin $\theta$ and cos $\theta$ respectively to a sin $(\theta-\chi)$ generator 48 and a cos $(\theta-\chi)$ generator 50. These circuits electrically form trigonometric identities:

$$(\sin\theta\cos\chi)-(\cos\theta\sin\chi)=\sin(\theta-\chi)$$

$$(\cos\theta\cos\chi)+(\sin\theta\sin\chi)=\cos(\theta-\chi)$$

wherein $\theta$ is the resolver input angle and $\chi$ represents a set of discrete switchable angles having the values of $5.625°+n$ $(11.25°$ for $n=0-7$. The generating circuits 48 and 50 are driven by a $\chi$ selection logic circuit 52 which, in turn, is driven by the digital counter 28. The output of the sin $(\theta-\chi)$ generator 48 connects to the summing junction of a main summing amplifier 54 along with an N–6-bit ladder network 56. The ladder network 56 receives a signal from the cos $(\theta-\chi)$ generator 50 and selects a suitable gain factor for application to the amplifier 54 on command from the counter circuit 28 also connected thereto. The output of the amplifier 54 provides a main summing amplifier signal, MSA, to the error sample-and-hold circuit 32 and to a comparator circuit 58. The comparator 58 detects the output of the amplifier and responds by providing either a logic "one" or logic "zero" to the digital counter-and-storage section 28 for storage therein in the form of a preliminary digital word. The output from the cos $(\theta-\chi)$ generator 50 is further supplied to the reference sample-and-hold circuit 40 as the reference signal REF.

The analog-to-digital converter just described with reference to FIG. 2 is generally well known and has been marketed in the form of a resolver-to-digital converter for several years by the assignee of the present invention. Therefore, further description will not be included here.

Figure 3:
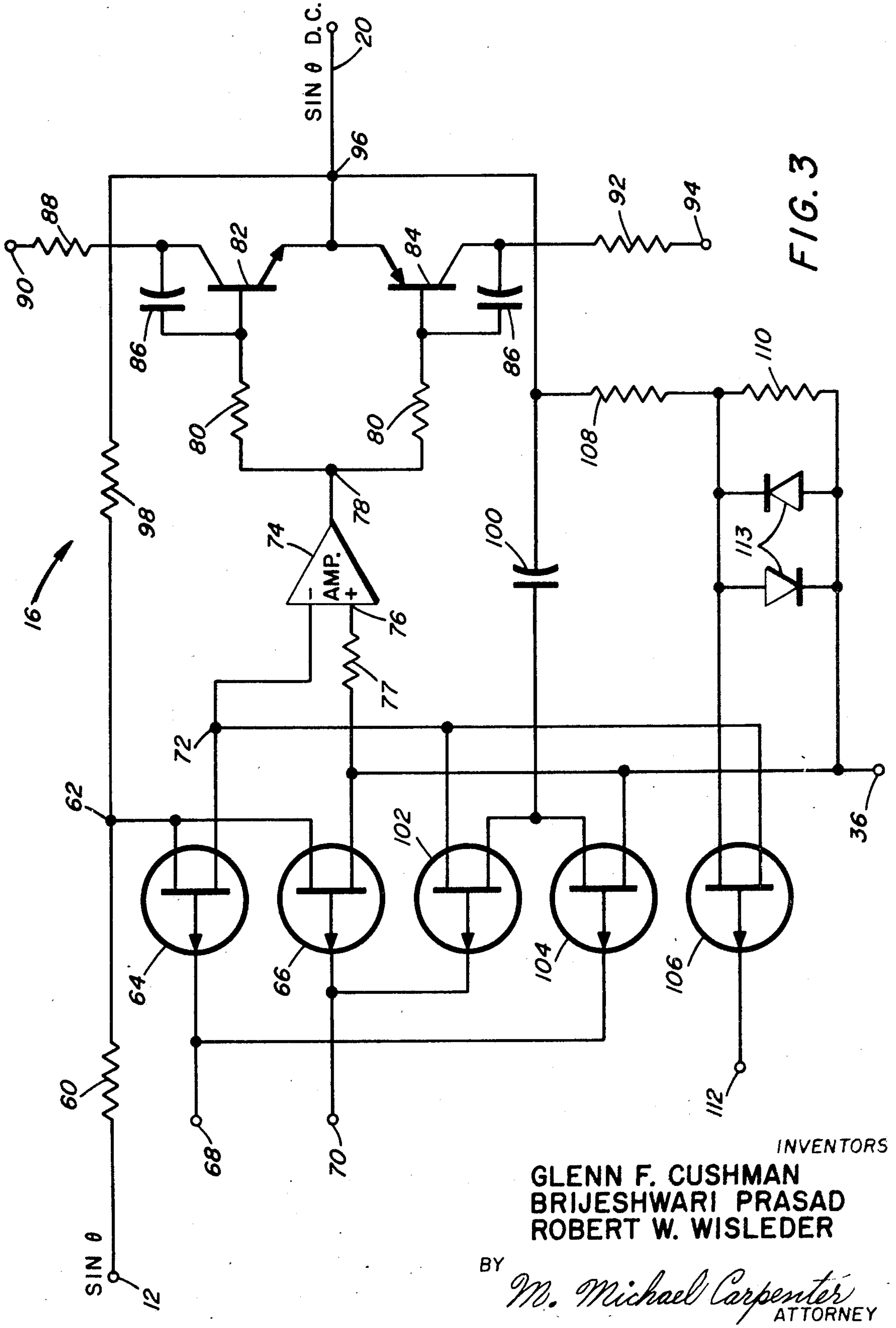
FIG. 3 is a schematic diagram, showing a sample-and-hold circuit useful at the input of the converter.

Referring now to FIG. 3, the details of the sin $\theta$ and cos $\theta$ sample-and-hold circuits 16 and 18 are shown. As each circuit is substantially identical, only one circuit, the sin $\theta$ sample-and-hold circuit 16, will be described herein. The analog input terminal 12 connects through a resistor 60 to a node 62 which forms a summing junction connected, in turn, to the source electrodes of two field effect transistor (FET) switches, 64 and 66. The gate electrode of FET 64 connects to a sample signal input terminal 68 to which a timing signal for a sample period is applied. Similarly, the gate electrode of the FET 66 connects to a hold signal input terminal 70 to which a hold period timing signal is applied. The drain electrode of FET 64 connects to a signal input terminal 72 of an operational amplifier 74 having a reference input terminal 76 connected through a resistor 77 to a source of reference potential 36, such as ground. The drain electrode of the FET 66 also connects to the reference potential 36.

An output terminal 78 from the operational amplifier 74 feeds through parallelly connected resistors 80 to the base of an NPN-transistor 82 and the base of a PNP-transistor 84 which are emitter connected. Each transistor 82 and 84 is provided with a capacitor 86 connected from the collector to the base thereof. The collector of transistor 82 connects via a current-limiting resistor 88 to a source of positive potential 90, while the collector of transistor 84 connects via a second current-limiting resistor 92 to a source of negative potential 94. The sin $\theta$ output terminal 20 connects through an output node 96 to the emitter junction between the transistors 82 and 84. The node 96 is connected via a resistor 98 to the summing junction 62 for completing the operational amplifier configuration.

The memory portion of the sin $\theta$ sample-and-hold circuit 16 includes a capacitor 100 connected between the output node 96 and the source electrodes of a pair of FET's 102 and 104. The gate electrode of FET 102 connects to the hold signal input terminal 70, while the sample signal input terminal 68 connects to the gate electrode of the FET 104. The drain electrode of FET 102 connects to the signal input terminal 72 of the operational amplifier 74 for connecting the capacitor 100 thereto during the hold period of the sample-and-hold circuit 16. Similarly, the drain electrode of the FET 104 is connected to the reference potential 36 during the sample period of the sample-and-hold circuit 16. Through this switching arrangement, the analog input signal is applied during the sample period through FET 64 to the signal terminal 72 of the operational amplifier 74; while the capacitor 100 is connected to the reference potential 36 through the FET 104. During the hold period, the analog input signal is applied through FET 66 to the reference potential 36; and the capacitor 100 is connected to the signal terminal 72 via FET 102.

The sample-and-hold circuit 16 is also utilized during a correction period when the offset error $E_O$ is removed from the residual analog error signal $E_R$. This portion of the circuit includes an FET 106 having its drain electrode connected to the signal input terminal 72 and its source electrode connected through a resistor 108 to a point between the output node 96 and one electrode of the capacitor 100. The drain electrode is also connected through a second resistor 110 to the point of reference potential 36, while the gate electrode is connected to a correction signal input terminal 112. Through this arrangement, the resistor 110 is placed between the signal input terminal 72 of the operational amplifier 74 and the reference potential 36 during the correction period. The junction of resistors 108 and 110 is further connected to reference potential 36 via a parallel combination of two diodes 113 to protect the FET 106 against forward biasing.

As indicated hereinabove, the sin $\theta$ sample-and-hold circuit 16 is identical to the cos $\theta$ sample-and-hold circuit 18. Each of these circuits are provided with output terminals 20 and 22, respectively, which connect to the input of the analog to digital converter 24, FIG. 2. The main summing amplifier output MSA connects to the input terminal of the error sample-and-hold circuit 32, while the reference signal REF is applied to the input terminal of the reference sample-and-hold circuit 40.

Figure 4:
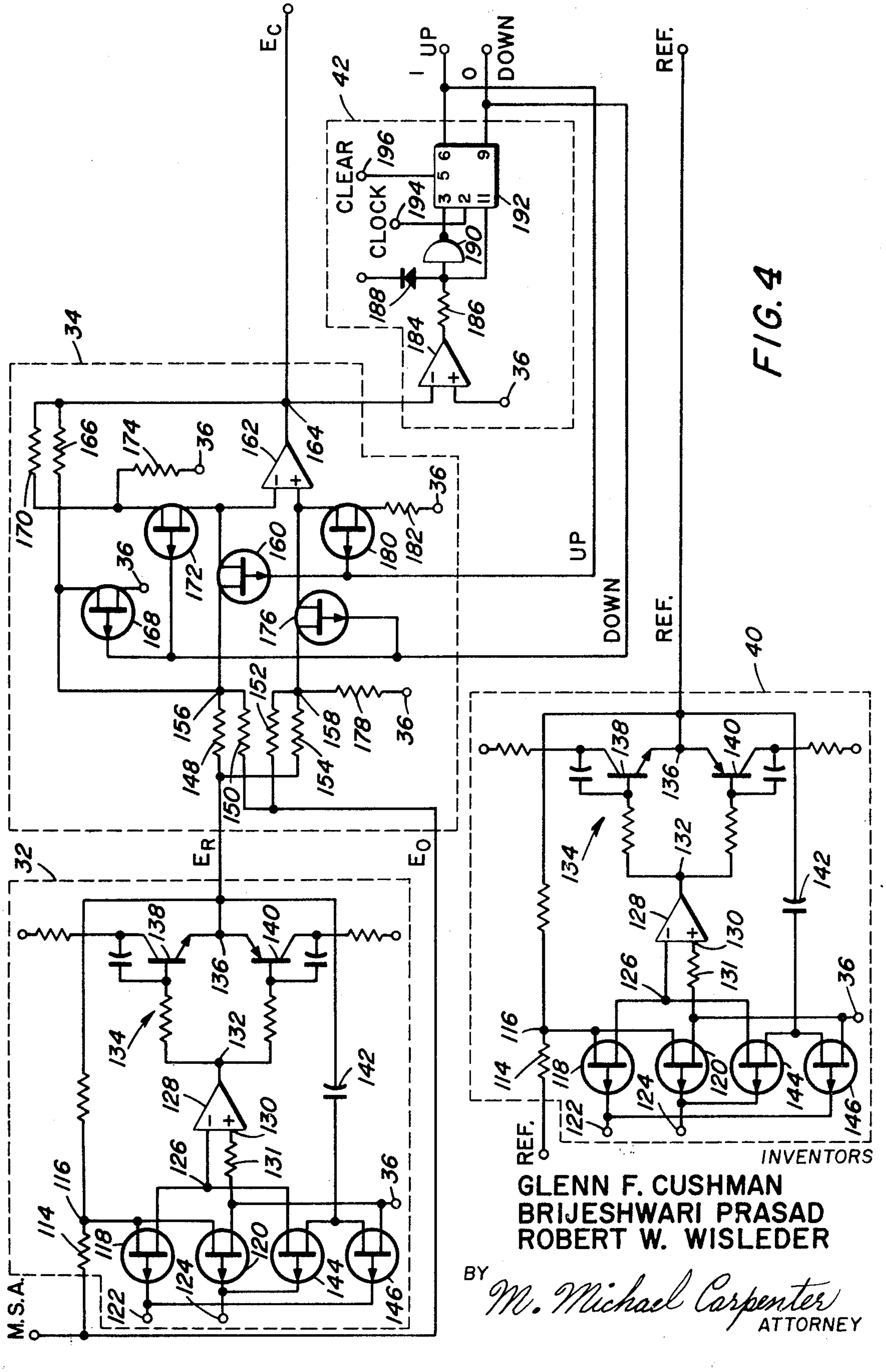
FIG. 4 is a schematic diagram, showing sample-and-hold circuits, a summing circuit and a polarity detect circuit used within the correction circuit of the present invention.

In FIG. 4, the main summing amplifier signal is applied over the MSA line to the input terminal of the error sample-and-hold circuit 32 where it is fed through a resistor 114 to a summing junction 116. The summing junction 116 connects to the source electrodes of a pair of FET's 118 and 120 having their gate electrodes connected respectively to a sample signal input terminal 122 and a hold signal input terminal 124. A signal input terminal 126 of an operational amplifier 128 is connected to the drain electrode of the FET 118. Similarly, the drain electrode of the FET 120 connects to a source of reference potential 36, such as ground. A reference terminal 130 of the operational amplifier 128 is connected to the reference potential 36 via a resistor 131. The output terminal 132 of the operational amplifier 128 connects to an output circuit 134 which is substantially the same as the output circuit illustrated and described in FIG. 2. An output node 136 located between the emitters of transistors 138 and 140 within the output circuit 134 is connected to the residual analog error signal line $E_R$. A feedback memory capacitor 142 connects between the node 136 and the source electrodes of FET's 144 and 146. The drain electrode of the FET 144 connects to the input signal terminal 126, while the drain electrode of FET 146 connects to the reference potential 36. FET 144 is controlled by the hold signal input terminal 124 which connects to the gate electrode thereof. The sample signal input terminal 122 connects to the gate electrode of the FET 146 for completing the circuit.

It will be noted that the error sample-and-hold circuit 32 is substantially the same as the sin $\theta$ sample-and-hold circuit 16 described hereinabove with regard to FIG. 3. The reference sample-and-hold circuit 40 is identical to the error sample-and-hold circuit 32; and, therefore, like numbers have been applied to like components shown therein. The reference signal REF from the cos $(\theta-\chi)$ generator 50 is applied to the input terminal of the reference sample-and-hold circuit 40 and applied through the resistor 114 thereof and the FET 118 to the input signal terminal 126 of the operational amplifier 128. The output of the operational amplifier 128 is stored within the memory capacitor 142 during the hold period of the reference sample-and-hold circuit. The output of this circuit is applied over the reference line REF to the analog-to-digital converter 38, FIG. 1. The summing circuit 34, receives the residual analog error signal $E_R$ and the offset error signal $E_o$ through parallel summing networks comprising resistors 148, 150, 152 and 154, wherein the residual analog error signal $E_R$ is connected through resistor 148 to a summing node 156 and the offset error signal $E_o$ is connected through resistor 150 to the same summing node 156. Similarly, the residual analog error signal $E_R$ is connected through resistor 154 to a second summing node 158 and the offset error signal $E_o$ is connected through resistor 152 to the same summing node 158. The summing node 156 is connected to the source electrode of an FET 160 whose drain electrode connects to the inverting input signal terminal of an operational amplifier 162. The gate electrode of the FET 160 connects to an up signal line which receives a control signal from the polarity detect circuit 42. The output of the operational amplifier 162 is connected to an output node 164 which connects through a resistor 166 to the summing node 156. The source electrode of an FET 168 also connects to the summing node 156, while the drain electrode thereof is connected to a point of reference potential 36, such as ground. The gate electrode of FET 168 connects to a down signal line connected to the output of the polarity detect circuit 42.

A second resistor 170 connects the output node 164 from the output of amplifier 162 to the drain electrode of an FET 172. The source electrode of the FET 172 connects to the inverting input terminal of the operational amplifier 162, and the gate electrode thereof connects to the down signal line. A resistor 174 connects the drain electrode to the reference potential 36. The second summing node 158 is connected to the source electrode of a fourth FET 176 whose drain electrode connects to the noninverting terminal (heretofore called reference terminal) of the operational amplifier 162. The summing node 158 is also connected to the point of reference potential 36 by a serially connected resistor 178. The down signal line from the polarity detect circuit 42 is attached to the gate electrode of the FET 176 for applying control information thereto. The source electrode of a final FET 180 is connected to the noninverting input terminal of the operational amplifier 162, while the drain electrode thereof is connected through a resistor 182 to the source of reference potential 36. The gate electrode connects to the up signal line from the polarity detect circuit 42.

The output of the summing circuit 34 is connected from the output node 164 to the polarity detect circuit 42 and the error analog-to-digital conversion circuit 38 as the corrected error signal $E_c$. The polarity detect circuit 42 includes an input amplifier 184 which receives the corrected error signal $E_c$ at one input terminal and compares it with a reference signal at a second input terminal thereof connected to the point of reference potential 36. The output of the input amplifier 184 is fed through a resistor 186 to the anode of a diode 188. The cathode of diode 188 is connected to a source of positive reference potential, such as +5 volts DC. The anode of the diode 188 is also connected through an inverter 190 to an input terminal of a clocked flip-flop 192 and connected directly to a second input terminal of the flip-flop 192. Also connected to the flip-flop 192 are clock and clear terminals 194 and 196, respectively. The logic "one" output terminal of the flip-flop 192 connects to the up signal line of the polarity detect circuit 42, while the logic "zero" terminal thereof connects to the down signal line thereof.

Thus far, the signals applied over the $E_R$ and $E_o$ signal lines have been discussed as if they are controlled only by the analog-to-digital converter 24 and the switching of the sample, hold or correction signal input terminals within the sample-and-hold circuits 16, 18, 32 and 40. The amplifier 184 compares the signal received over the corrected-error signal line $E_c$ against a reference potential 36, such as ground. The output of the amplifier 184 is limited to a +5 volts by the diode 188. During preliminary conversion, flip-flop 192 is cleared so that the up signal line is low. Assuming that the corrected error signal $E_C$ is negative, it can be assumed that the residual analog error $E_R$ is less than the corrected error signal $E_o$ and that the signal from the polarity detect circuit 42 to the digital counter-and-storage circuits 28 would cause that counter to count down (downline at logic one). If this is not the case, the signal applied to the amplifier 184 is positive, indicating that the residual analog error signal $E_R$ is greater than the offset error signal $E_o$. Thus, the polarity detect circuit 42 applies a signal to the summing circuit 34 for reversing the inputs to the amplifier 162 therein. This same signal is also applied to the digital counter-and-storage circuit 28, wherein a signal applied thereto causes the counter to count up (up line at logic one).

It may be seen that the up and down signals are applied to the FET's within the summing circuit 34 wherein the up signal line is connected to FET's 160 and 180 for connecting (when up line is at logic zero) the signals $E_R$ and $E_O$ to the inverting terminal of the operational amplifier 162 and connecting the noninverting terminal thereof to the point of reference potential 36 through the resistor 182. When the down signal is at logic zero, the FET 176 connects the noninverting terminal of amplifier 162 to the $E_R$ and $E_O$ lines while FET 172 connects the inverting terminal thereof to the reference potential 36 through the resistor 174. The FET 168 operates when logic zero is applied to the down signal line to properly adjust the feedback resistance of the operational amplifier 162.

Figure 5:
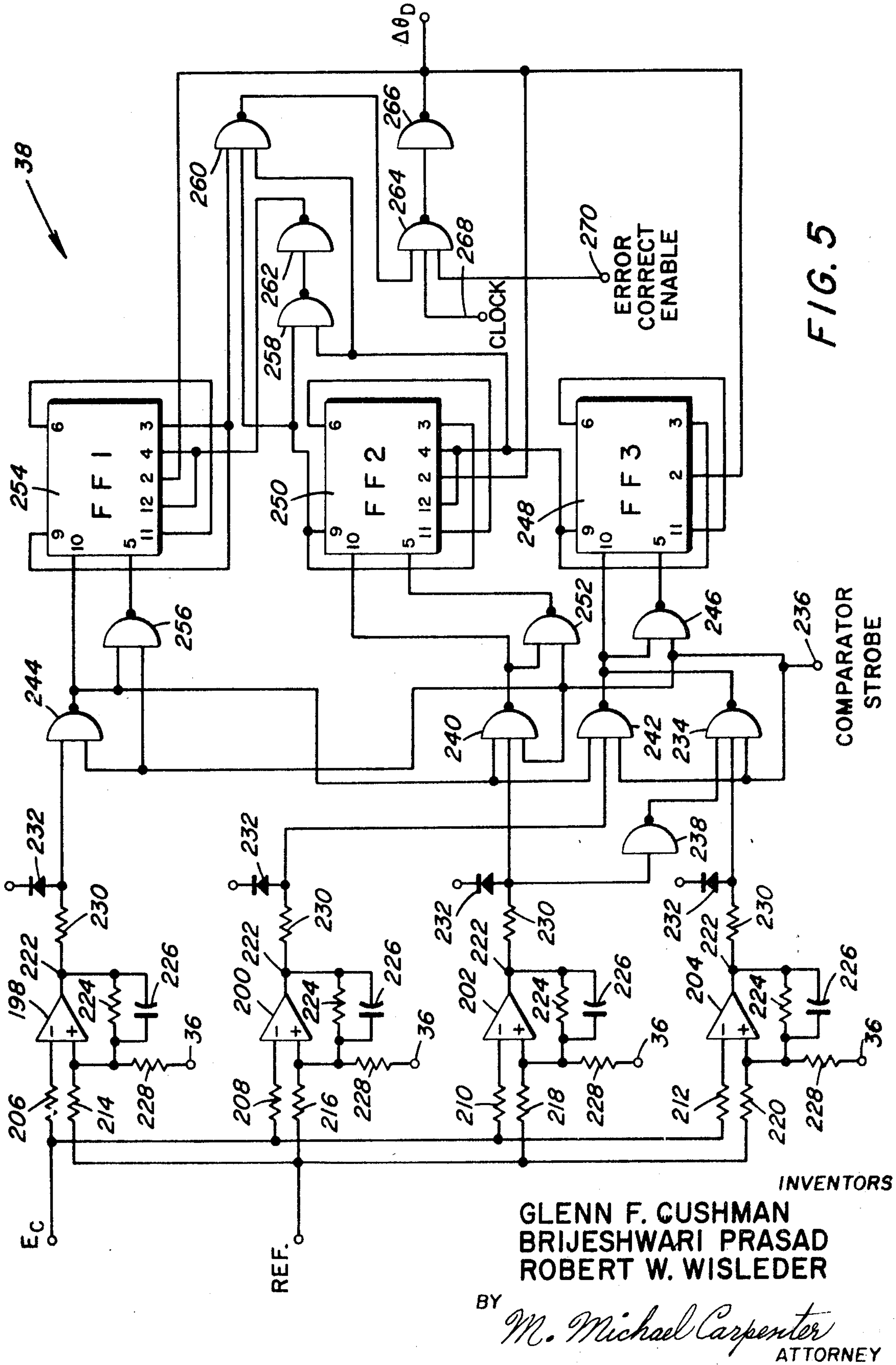
FIG. 5 is a schematic diagram, showing an error analog-to-digital converter embodied in the correction circuit of the present invention.

The corrected error signal $E_C$ is provided over the line thus marked to the input of the error analog-to-digital conversion circuit 38, while the reference signal REF from the reference sample-and-hold circuit 40 is provided over the line marked REF thereto. The error analog-to-digital conversion circuit 42 is illustrated in FIG. 5, having four operational amplifiers 198, 200, 202 and 204 whose negative input terminals are respectively connected through resistors 206, 208, 210 and 212 to the corrected error signal line $E_C$. The positive input terminals of the operational amplifiers 198–204 connect through resistors 214, 216, 218 and 220, respectively, to the reference signal line REF. As each operational amplifier is provided with a similar feedback circuit, only one feedback circuit will be described, that relating to operational amplifier 198. However, like numbers will be applied to the other feedback circuits utilized with amplifier 200–204. An output terminal 222 of the operational amplifier 198 connects through a feedback resistor 224 to a positive input terminal thereof. A capacitor 226 is connected in parallel feedback arrangement around the resistor 224; while a bias resistor 228 connects the positive terminal of the operational amplifier 198 to a point of reference potential 36, such as ground. The output terminal 222 connects through a resistor 230 to the anode of a clamping diode 232 having the cathode thereof connected to the source of a reference potential, such as +5 volts DC.

The operational amplifiers are arranged to provide a positive output signal when the corrected error signal $E_C$ is less than reference signal REF applied to the input terminals. Therefore, resistors 214, 216, 218 and 220 respectively increase in value according to the ratio of 1:2:4:8. Due to this arrangement, the smallest reference signal REF is applied to the noninverting input terminal of the operational amplifier 204; while the largest reference signal REF is applied to the noninverting input terminal of operational amplifier 198. Thus, it will be seen that the output of amplifier 204 is the first output to go positive while the output of the operational amplifier 198 goes positive last.

The output terminal 222 of operational amplifier 204 connects to one input terminal of a NAND-gate 234 via resistor 230, having a second input connected to a clock terminal 236. The output of operational amplifier 202 connects through an inverter 238 to the third input of the NAND-gate 234 and connects to a first input terminal of a NAND-gate 240. The operational amplifier 200 is arranged with its output connected to the input of a NAND-gate 242 having a second input thereof connected to the clock terminal 236. The output of the amplifier 198 connects to a NAND-gate 244 with a second input of that gate connected to the clock terminal 236. The output of the NAND-gate 244 connects to the third input terminals of NAND-gates 240 and 242. The clock terminal 236 also connects to the input of the NAND-gate 240. The outputs of NAND-gates 234 and 242 are tied together and connected to the input of a NAND-gate 246 having a second input connected to the clock terminal 236. The output of NAND-gates 234 and 242 also connects to the set direct terminal of a clock-gated flip-flop 248, while the output of the NAND-gate 246 is connected to the clear direct terminal thereof. Similarly, the output of NAND-GATE 240 connects to the set direct terminal of a second clock-gated flip-flop 250 and to one input terminal of a NAND-gate 252. The second input of the NAND-gate 252 is connected to the clock terminal 236, while the output thereof connects to the clear direct terminal of the clock gated flip-flop 250. The output of the NAND-gate 244 connects to the set direct terminal of a third clock-gated flip-flop 254 and to one terminal of a NAND-gate 256. The second input of the NAND-gate 256 connects to the clock terminal 236 and the output connects to the clear direct terminal of clock-gated flip-flop 254.

Flip-flops 248, 250 and 254 are connected to form a three-bit parallel binary output. Each clock-gated flip-flop includes a pair of AND gates connected respectively to the clock-and-set inputs of a flip-flop. The flip-flop is also provided with a toggle input, clear direct and set direct inputs, and logic "one" and logic "zero" outputs. For convenience, these inputs and outputs have been numbered as follows: toggle input 2; AND-inputs 3, 4 and 11, 12; clear direct input of 5; set direct input 10; logic zero output 9; and logic one output 6. Flip-flop 248 is connected with the logic one terminal 6 tied to the AND-terminal 11, and the logic one terminal 9 tied to the AND-input terminal 3. The toggle terminal 2 is tied to the output line $\Delta\theta_D$ for providing synchronized control over the counter. It will be noted that each flip-flop is provided with the zero logic output 9 connected to the AND-input 3 and the one logic output 6 connected to the AND-input 11 for toggling the flip-flop. The logic zero output 9 of flip-flop 248 is connected to input terminals 4 and 12 of the flip-flop 250, and also connected to the input of a NAND-gate 258 and a NAND-gate 260. the toggle input 2 of flip-flop 250 is connected to the $\Delta\theta_D$ output line over which the digital error signal is applied to the digital counter and storage circuit 28. The logic "zero" output terminal 9 of flip-flop 250 connects to the second input of the NAND-gate 258 and to an input of the AND-gate 260. The output of the NAND-gate 258 is applied through an inverter 262 to the input terminals 4 and 12 of the flip-flop 254. The toggle input 2 of this flip-flop 254 is driven by the $\Delta\theta_D$ output line while the logic "zero" output terminal 9 is connected to the third and last input terminal of the NAND-gate 260. The output of NAND-gate 260 connects to one input of a NAND-gate 264 which connects through an inverter 266 to the digital error signal line $\Delta\theta_D$. The NAND-gate 264 is controlled by a clock input terminal 268 and an error correct enable terminal 270 for completing the circuit of the error analog-to-digital converter 38.

It will be seen that the error analog-to-digital conversion circuit 38 receives the corrected error signal $E_C$ and compares it against the reference signal REF for providing a digital output representing the correction needed for the least significant bits of the binary output. This output is provided in the form of a digital error signal $\Delta\theta_D$ to the digital counter-and-storage circuit 28 where it is applied to the preliminary digital signal $\theta_{D1}$ for producing the corrected digital output signal $\theta_{D2}$.

The operation of the error correction circuit in combination with the analog-to-digital converter will now be described with regard to FIG. 1. A sin $\theta$ and cos $\theta$ input signal is received at the analog input terminals 12 where the peak signals of each function are sampled and stored by the sample-and-hold circuits 16 and 18. A DC output level representing the sin $\theta$ and cos $\theta$ is then applied to the analog section 26 of the analog-to-digital converter 24. At this time, a preliminary conversion is made whereby a preliminary digital signal $\theta_{D1}$ results in the digital counter-and-storage section 28 of the analog-to-digital converter 24. At the end of the preliminary conversion, there is a residual analog error signal $E_R$ at the output of the amplifier 54 which equals:

$$E_R = \theta in - \theta_{D1} + E_O \quad (1)$$

Where $\theta in$ is the analog input quantity, $\theta_{D1}$ the preliminary digital signal, and $E_o$ the offset and switching error signal. The residual analog error signal $E_R$ is stored in the sample-and-hold circuit 32 while an internally generated reference signal REF is stored within the reference sample-and-hold circuit 40.

Next, the sample-and-hold circuits 16 and 18 are used to sample the source of reference potential 36 by using the FET's 106 therein. The resulting analog error signal which is generated is the offset error signal $E_O$ of the system. This signal is applied directly to the summing circuit 34 where it is subtracted from the residual analog error signal $E_R$ stored within the error sample-and-hold circuit 32. The results of this arithmetic may be expressed as follows:

$$E_C=E_R-E_O=(\theta in-\theta_{D1}+E_O)-E_O=\theta in-\theta_{D1} \quad (2)$$

That is, the corrected error signal $E_C$ is equal to the difference between the analog input quantity $\theta in$ and the preliminary digital quantity $\theta_{D1}$ wherein the offset errors have been cancelled out. This signal, $E_C$ is then applied to the error analog-to-digital converter 38 wherein the digital equivalent of this signal (within the quantizing accuracy of $\pm E_q$, one-half of a least significant bit) or the digital error signal $\Delta\theta_D$ is obtained. The digital error signal $\Delta\theta_D$ is then fed to the digital counter-and-storage circuit 28 within the analog-to-digital converter 24 where it is subtracted from or added to the preliminary digital signal $\theta_{D1}$ for correcting the preliminary signal stored therein and producing an accurate corrected digital output signal $\theta_{D2}$ as follows:

From equation (1) $\theta_{D1}=\theta in-E_R+E_O \quad (3)$

From equations (2) and (3) $\Delta\theta_D=E_C\pm E_q=E_R-E_O\pm E_q$

Adding $\theta_{D2}=\theta_{D1}+\Delta\theta_D=\theta in\pm E_q$

Thus the analog-to-digital converter of the present invention provides a corrected digital output signal $\theta_{D2}$.

The present invention upgrades an analog-to-digital converter by increasing the accuracy thereof. This is achieved through a unique arrangement which is capable of measuring the amount of error between an analog input and a preliminary digital signal. The measured error is then corrected and the resulting analog error signal is converted to a digital signal which is subtracted from or added to the preliminary digital signal for providing a corrected output signal. This arrangement eliminates errors caused by amplifier offset, voltage drift within the analog-to-digital converter, and also eliminates switching errors therein. This is accomplished through an arrangement which allows the analog-to-digital computation to be completed prior to correcting the preliminary digital signal, at which point the amplifiers and switches are frozen. That is, the amplifiers and switches which establish the signal path for the preliminary digital signal are retained in that configuration while the correction digital error is generated. Thus the effect of continuously switching different amplifiers and switches into the signal path as the signal correction is made is eliminated.

While the present invention has been described as a correction scheme for a resolver-to-digital converter, it will be understood that the invention may also be used within similar linear and nonlinear analog-to-digital converting circuits with only slight modification. With this in mind, it will also be understood that the present invention should be limited only by the appendant claims.

The embodiments of the invention in which an exclusive property or privilege is claimed are defined as follows:

1. An error correction circuit for an analog-to-digital signal converter, comprising:

an analog-to-digital converter including input circuit means for receiving an analog input signal to be converted, and counter-and-storage circuit means for storing said analog input signal as a preliminary digital signal;

said input circuit means including means for generating error signals representing the analog difference between said analog input signal and said stored preliminary digital signal;

error sample-and-hold means connected to said means for generating error signals included in said input circuit means for receiving and holding said error signals generated therefrom;

analog error to digital error conversion means for receiving said error signals from said error sample-and-hold means and converting said signals to a digital error signal; and said counter-and-storage circuit means connected to said analog error to digital error conversion means for receiving said digital error signals and correcting said preliminary digital signal stored therein, thus converting said preliminary signal to a corrected digital output signal.

2. An error correction circuit for an analog-to-digital converter as claimed in claim 1, additionally comprising:

said input circuit means including means for generating a reference signal indicative of said preliminary digital signal;

reference sample-and-hold means connected to said means for generating a reference signal included in said input circuit means for receiving and holding said reference signal generated therefrom;

said analog error to digital error conversion means connected to said reference sample-and-hold means for comparing said error signals from said error sample-and-hold means with said reference signals from said reference sample-and-hold means.

3. An error correction circuit for an analog-to-digital converter as claimed in claim 1, additionally comprising:

sample-and-hold means for sampling said analog input signal to be converted and holding said signal for receipt by input circuit means included in said analog-to-digital converter;

said sample-and-hold means including a reference potential and switching means for connecting said sample-and-hold means and thus said input circuit means of said analog-to-digital converter alternately to said analog input signal and then to said reference potential;

said error sample-and-hold means connected to said means for generating error signals including an error sample-and-hold circuit, a summing circuit, means connecting said error sample-and-hold circuit between said means for generating error signals included in said input circuit means and said summing circuit, and means connecting said means for generating error signals included in said input circuit means directly to said summing circuit;

said summing circuit having an output connected to said analog error to digital error conversion means; and means controlling said switching means for connecting said sample-and-hold means to said reference potential thus generating an offset error signal which is applied to said summing circuit through said input circuit means and said means connecting said means for generating error signals included in said input circuit means directly to said summing circuit;

said summing circuit generating a corrected error signal formed from the difference between said offset error signal and said error signals stored within said error sample-and-hold means which is applied over said summing circuit output to said analog error to digital error conversion means.

4. An error correction circuit for an analog-to-digital converter as claimed in claim 3, additionally comprising:

polarity detect means connected to said summing circuit output for detecting the polarity of said corrected error signal and generating an output response thereto, means connecting said output response from said polarity detect means to said summing circuit for reversing said polarity of said corrected error signal where necessary; and means connecting said output response from said polarity detect means to said counter-and-storage circuit means for controlling the count direction of said digital error signal from said analog error to digital error conversion means as said digital error signal is applied to said counter-and-storage circuit means.

5. An error correction circuit for an analog-to-digital converter, comprising:

input signal sample-and-hold means connected to receive an analog input signal to be converted to a digital output signal;

said input sample-and-hold means including a reference potential and input switching means for connecting said input sample-and-hold means to said reference potential;

an analog-to-digital converter including analog input circuit means for receiving said analog input signal, and counter and digital storage circuit means for storing said analog input signal as a preliminary digital signal;

said analog input circuit means including means for generating an error signal representing the analog difference between said analog input signal and said stored preliminary digital signal and means for generating a reference signal representing the magnitude levels of said analog input signal;

error sample-and-hold means connected to said means for generating an error signal for receiving and holding said error signal;

summing circuit means connected to said means for generating an error signal for receiving said error signal therefrom and connected to said error sample-and-hold means for receiving said error signal held therein;

reference sample-and-hold means connected to said means for generating a reference signal for receiving and holding said reference signal;

error analog-to-digital conversion means connected to receive said error signal from said summing circuit means and to receive said reference signal held in said reference sample-and-hold means having an output connected to said counter and digital storage circuit means;

means controlling said input-switching means within said input sample-and-hold means for connecting said input sample-and-hold means to said reference potential thus generating an offset error signal as said error signal;

said means controlling said input-switching means controlling said error sample-and-hold means for placing said means in a hold position thereby applying said error signal held therein to said summing circuit as said offset error signal is applied thereto for generating a corrected error signal free of said offset error signal therefrom; and said means controlling said input-switching means also controlling said reference sample-and-hold means for placing said means in a hold position thereby applying said reference signal held therein to said error analog-to-digital conversion means to generate a digital signal representing said corrected error signal for application to said counter and digital storage circuit to correct said stored preliminary digital signal; whereby a corrected digital signal equaling said analog input signal is produced.

6. An error correction circuit for an analog-to-digital converter as claimed in claim 5, additionally comprising:

polarity detect means connected to said summing circuit means for detecting the polarity of said corrected error signal produced thereby;

said summing circuit including switching means controlled by said polarity detect means for switching said error signal and said offset error signal applied thereto in response to said polarity of said corrected error signal generated therefrom; and said polarity detect means connected to said counter and digital storage circuit means for determining the direction of count of said digital signal representing said corrected error signal during the correction of said preliminary digital signal stored therein.

7. An error correction circuit for an analog-to-digital converter as claimed in claim 5, wherein said summing circuit means comprises:

input terminal means for receiving said error signal and said offset error signal;

amplifier means including first and second input terminals and an output terminal;

first summing means connected to said input terminal means for summing said error and said offset error signals, second summing means connected to said input terminal means for summing said error and said offset error signals;

a source of reference potential;

first switching means connecting said first summing means to said first amplifier input terminal and connecting said second amplifier input terminal to said source of reference potential; and second switching means connecting said second summing means to said second amplifier input terminal and connecting said first amplifier input terminal to said source of reference potential, thereby controlling the signal polarity of said corrected error signal at said output terminal.

8. An error correction circuit for an analog-to-digital converter as claimed in claim 7, additionally comprising polarity detect circuit means including:

amplifier means having an input for receiving said corrected error signal and an output for an output signal;

limiting means connected to said output to limit aid output signal;

flip-flop means having first and second outputs and an input connected to receive said amplifier output signal and arranged to change state when said output signal drops below a predetermined level; and said first and second outputs connected respectively to said first and second switching means within said summing circuit for controlling said first and second switching means and said polarity of said corrected error signal.

9. An error correction circuit for an analog-to-digital converter as claimed in claim 5, wherein said sample-and-hold means each comprise:

an input terminal for receiving one of said signals to be sampled and held;

a summing junction;

a source of reference potential;

an amplifier having an input terminal connected to said summing junction, an input terminal connected to said source of reference potential, and an output terminal;

memory means connected to said amplifier output terminal;

first switching means connecting said input terminal to said summing junction and connecting said memory means to said source of reference potential for sampling one of said signals; and second switching means connecting said input terminal to said source of reference potential and connecting said memory means to said summing junction for holding one of said sampled signals and providing an output signal at said output terminal equaling said held signal.

10. An error correction circuit for an analog-to-digital converter as claimed in claim 9, wherein said sample-and-hold means include said error sample-and-hold means and said reference sample-and-hold means, and said first and second switching means include pairs of field effect transistors.

11. An error correction circuit for an analog-to-digital converter as claimed in claim 9, wherein said sample-and-hold means includes said input sample-and-hold means and additionally comprising:

resistance means;

said input switching for connecting said input sample-and-hold means to said reference potential connecting said resistance means between said source of reference potential and said summing junction; and said input switching means and said first and second switching means including field effect transistors.

* * * * *